United States Patent [19]

Buhrer

[11] 4,162,450

[45] Jul. 24, 1979

[54] PROGRAMMABLE DIVIDER

[75] Inventor: Carl F. Buhrer, Framingham, Mass.

[73] Assignee: GTE Laboratories Incorporated, Stamford, Conn.

[21] Appl. No.: 861,360

[22] Filed: Dec. 16, 1977

[51] Int. Cl.² .............................................. H04B 1/26
[52] U.S. Cl. ..................... 325/419; 325/421; 331/1 A
[58] Field of Search ................. 331/1 A, 18, 25, 64; 332/20; 325/419, 421, 422, 455, 418, 420, 416, 423

[56] References Cited

U.S. PATENT DOCUMENTS 3,504,484  4/1970  Basse ........................................ 331/64
3,988,696  10/1976  Sharpe .................................... 331/1 A Primary Examiner—Benedict V. Safourek
Attorney, Agent, or Firm—David M. Keay

[57] ABSTRACT

An improved programmable divider employed in a frequency synthesizer which is part of an FM broadcast receiver. The programmable divider has a counter and counter control circuitry for dividing-down the output of a voltage controlled oscillator to the output of a reference frequency source. The counter control circuit causes the counter to count through a first fixed phase after which a second variable count phase takes place. The duration of the second phase is established by an analog input timing circuit and varies with the tuned frequency. After the second phase, the counter counts through a third fixed phase which is a function of the offset or intermediate frequency of the receiver.

8 Claims, 2 Drawing Figures

PROGRAMMABLE DIVIDER

BACKGROUND OF THE INVENTION

The present invention relates to programmable dividers. More particularly, it is concerned with an improved programmable divider for use in a frequency synthesizer which may be employed in an FM broadcast receiver.

Broadcast receivers for frequency modulated signals are generally of the superheterodyne type. Such receivers must have some means for stabilizing the local oscillator frequency against frequency drifting which can cause distortion of the received signal.

Automatic frequency control (AFC) systems use the received signal to stabilize the local oscillator frequency. However, AFC systems are ineffective when the received signal is weak or transmission on channels adjacent the received signal channel are particularly strong.

Another possible solution is to make the local oscillator so stable that an automatic frequency control systems becomes unnecessary; however, the cost of building a local oscillator with the required degree of stability is so high as to make this approach an undesirable one.

A third solution is to utilize a frequency synthesizer employing a phase-locked loop. In such a loop, the local oscillator signal is divided-down by an integer value to produce a submultiple frequency which nominally matches the frequency and phase of a fixed reference frequency output from a stable crystal oscillator. The programmable dividers which divide-down the local oscillator output are digital logic devices which have required a digital input to select the tuned channel.

In more expensive communications equipment, the input to the programmable divider may be provided by thumb wheel switches, by keyboard data entry, or from the memory banks of a digital computer. These techniques for generating the divider input are generally not suited for entertainment quality FM broadcast receivers since they are too expensive and/or require the user to remember exact station frequencies. Many users have no desired to remember station frequencies and instead prefer to tune in stations simply by manipulating the tuning knob until the desired signal is received.

Since the signals provided by rotary tuning knobs are in analog form while the known programmable dividers have accepted only digital inputs, it has been thought to be necessary to provide an analog-to-digital conversion. Unfortunately, the componentry required for an analog-to-digital conversion is relatively complex and costly, making such a receiver possibly as expensive as a receiver having a direct digital input to the programmable divider.

SUMMARY OF THE INVENTION

The present invention combines the convenience (to the user) of an analog input with the technical advantages of the programmable divider approach in a low cost programmable divider for use in a frequency synthesizer having a phase-locked loop including an electrically controllable oscillator, a reference frequency source, and a phase detector circuit for comparing the output from the reference frequency source with a divided-down output from the electrically controllable oscillator. The divided-down output is generated by a programmable divider in accordance with the present invention. The divider includes a counter circuit means which counts through a recurring sequence of counts in response to applied clock pulses and has an output connection to the phase detector circuit. A counter control means includes means for applying clock pulses to the counter circuit means at a rate which is dependent upon the output from the electrically controllable oscillator. When the count in the counter circuit means reaches a first predetermined count, a timing means initiates a variable time delay period. Upon the termination of the time delay period a loading means loads a second predetermined count into the counter circuit means. When the counter circuit means has counted from the second predetermined count to a third predetermined count, it applies an output pulse to the phase detector circuit. A nominal frequency of the output pulses matches the output frequency of the reference frequency source.

For a better understanding of the present invention, together with other and further objects, advantages, and capabilities thereof, reference is made to the following discussion and appended claims in connection with the above-described drawings.

DETAILED DESCRIPTION OF THE INVENTION

Figure 1:
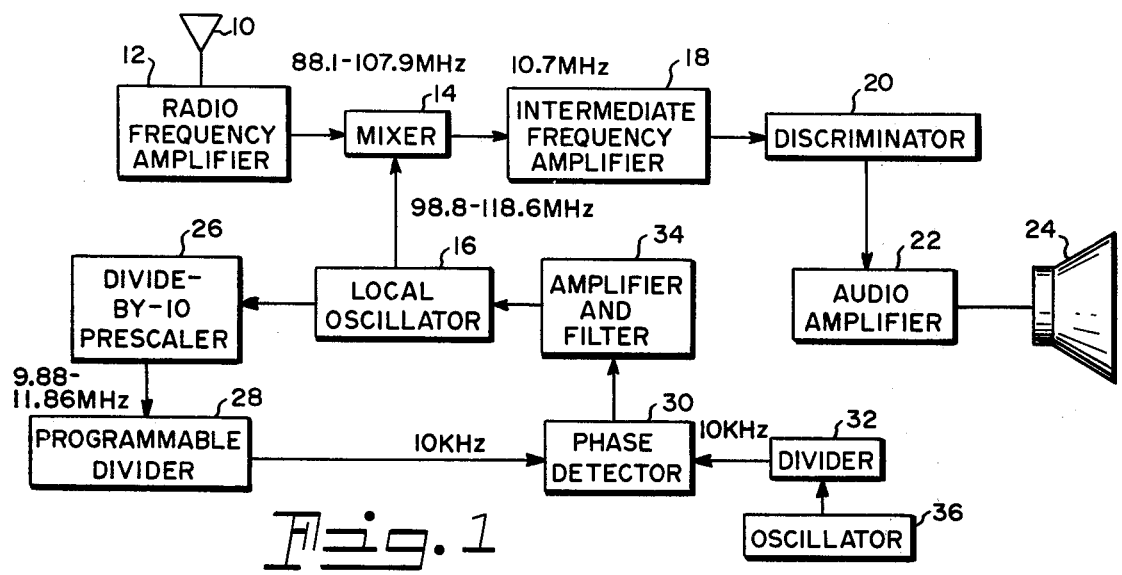
FIG. 1 is a block diagram of an FM broadcast receiver employing the programmable divider of the present invention.

Referring now to FIG. 1, frequency modulated signals detected by an antenna 10 are amplified by a radio frequency amplifier 12. At present, the assigned channels in the FM broadcast range are 0.2 MHz apart in an 88.1–107.9 MHz band. The amplified signals in this band are applied to a mixer circuit 14 which superheterodynes the radio frequency signals with signals produced by a local oscillator 16. In a preferred embodiment, the local oscillator 16 has a range of output frequencies which are offset from the range of received frequencies by an offset or intermediate frequency of 10.7 MHz. That is, signals appllied to the mixer 14 by the local oscillator 16 are in the range of 98.8–118.6 MHz.

The 10.7 MHz signal at the output of the mixer 14 is applied to an intermediate frequency amplifier 18, the output of which is applied to a discriminator circuit 20. The discriminator circuit 20 drives an audio amplifier 22 which in turn provides signals to a speaker 24.

The local oscillator 16 is a voltage controlled oscillator and is part of a phase-locked loop which includes a divide-by-ten prescaler 26, a programmable divider 28, a phase detector circuit 30, a reference frequency source consisting of an oscillator 36 and a divider 32, and an amplifier-filter circuit 34. The purpose of the phase-locked loop is to compare the output signal from the local oscillator 16 with a reference output signal from a highly accurate crystal oscillator 36 and divider 32, and to provide feedback needed to maintain the local oscillator output at a selected frequency.

The function of the divide-by-ten prescaler circuit 26 is to divide-down the 98.8–118.6 MHz output of the local oscillator 16 by a factor of 10. The prescaler lowers the frequency from the local oscillator 16 to a range in which the more complex digital logic of the programmable divider 28 can function properly, and, if desired, may be other than 10. With a divide-by-ten prescaler 26 an input of 9.88-11.86 MHz is applied to the programmable divider 28. Programmable divider 28 operates on this input to generate an output signal having a nominal frequency matching the frequency of the reference frequency source. That is, if the oscillator 36 and divider 32 combination has a 10 kHz output signal, then the output of the programmable divider 28 will also be a 10 kHz signal, at least in the absence of drift at the local oscillator 16. The signals provided by the programmable divider 28 and the reference frequency source are compared in a phase detector circuit 30 which generates an error signal proportional to the phase difference between the two inputs. This error signal is applied to amplifier and filter circuit 34 before being fed back to the local oscillator 16 to adjust the oscillator output frequency so as to diminish any phase difference between the output of the divider 28 and the reference frequency.

Figure 2:
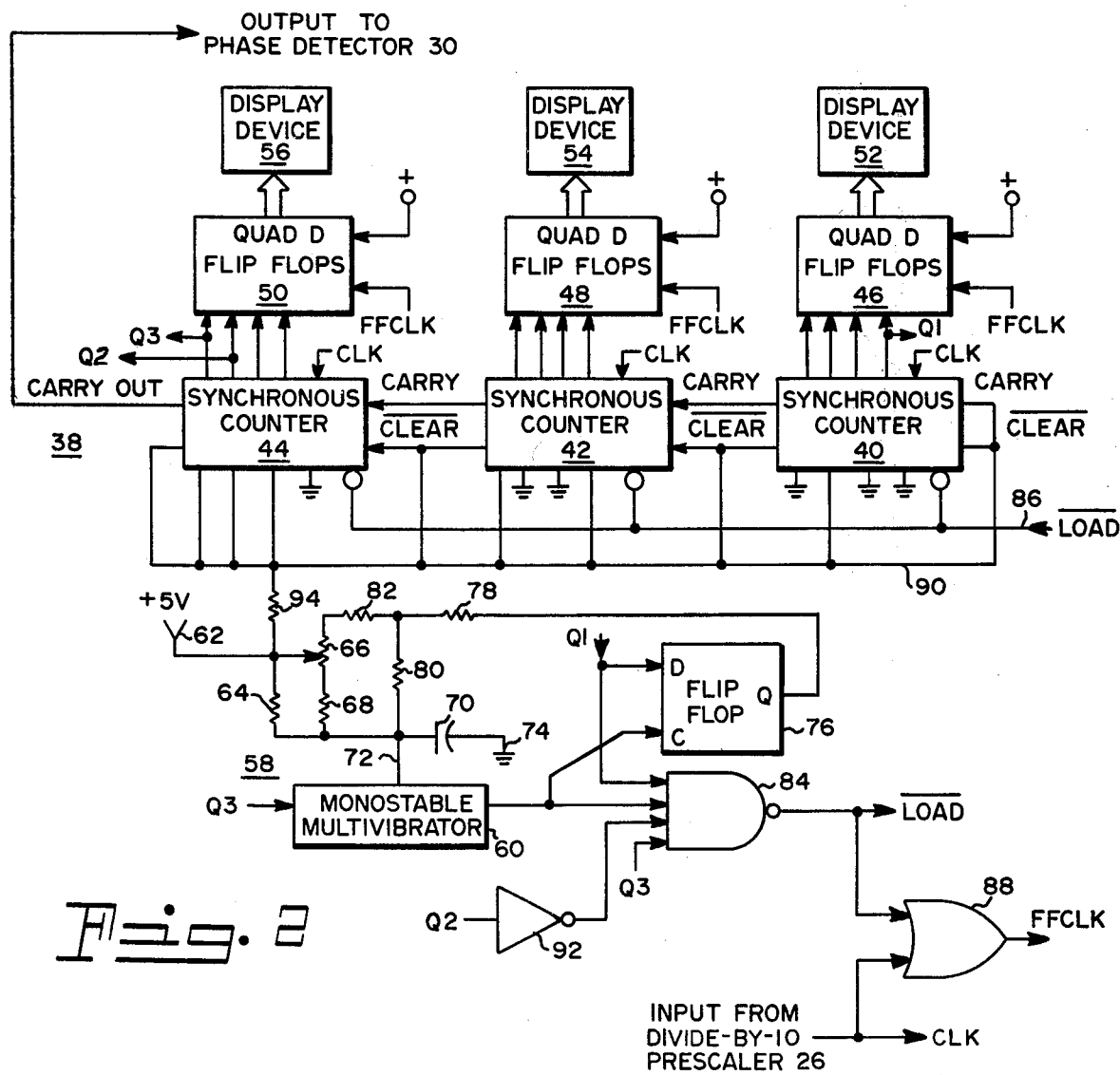
FIG. 2 is a schematic diagram of a programmable divider in accordance with the present invention.

With the exception of the programmable divider 28 all of the elements of the receiver described in FIG. 1 are conventional. Therefore, the only element to be described in detail is the programmable divider 28. FIG. 2 is a more detailed schematic diagram of the programmable divider 28 in accordance with the present invention. The programmable divider includes a counter 38, consisting of a number of cascaded synchronous counters 40, 42, and 44 to which clock signals CLK are applied. Counters 40 and 42, which may be type 74160, are operated as decade counters while counter 44, which may be type 74161, is operated as a hexadecimal counter. The source of the clock signals CLK is the divide-by-ten prescaler 26. Therefore, the synchronous counters 40, 42, and 44 are incremented at a frequency which is one-tenth the frequency to which the local oscillator 16 is tuned. Each output from a synchronous counter is applied to a flip-flop which can be clocked through an FFCLK connection from a counter control circuit to latch or store the output signal at the time of the FFCLK pulse. The quad D-type flip-flops 46, 48, and 50 are associated with the counters 40, 42, and 44, respectively. The outputs of the flip-flops 46, 48, and 50 are applied to display devices 52, 54, and 56, respectively, which are preferably seven segment display components of a conventional type and include binary to seven segment decoding circuitry.

Outputs from counters 40 and 44 are applied to a counter control circuit 58. More specifically, output Q1 of counter 40, which is the least significant output bit of the least significant decade is used. Also, outputs Q3 and Q2 of counter 44 are used. Output Q3 is the most significant bit of this stage while output Q2 is the next most significant bit.

Counter control circuit 58 includes a monostable multivibrator 60 which can be driven into a timing cycle at the positive-going edge of a Q3 pulse. The duration of the timing cycle for the monostable multivibrator is determined by a timing circuit which includes a source 62 of positive voltage, a first resistor 64, a variable resistor 66 (which is preferably a rotary potentiometer), a second resistor 68, and a timing capacitor 70 connected between a timing input 72 to the monostable multivibrator 60 and ground 74.

The counter control circuit also includes a flip-flop 76 connected to the input 72 of the monostable multivibrator 60 through a network of feedback resistors 78, 80, and 82. The function of the feeback loop will be described in more detail hereinbelow.

The counter control circuit further includes a quad input NAND gate 84 having one input from the monostable multivibrator 60 and inputs from the Q1 connection of synchronous counter 40 and the Q2 and Q3 connections of synchronous counter 44, the Q2 input being logically inverted by an inverter 92. The output of NAND gate 84 is a $\overline{\text{LOAD}}$-controlling signal which is applied both to load enabling input line 86 to each of the synchronous counters and to a dual input OR gate 88. A second input to the OR gate 88 is provided by the clock signal CLK from the prescaler 26.

Basically, the counter control circuit 58 causes the counter 38 to be driven repeatedly through a counting cycle which includes a first fixed number of counts followed by a second variable number of counts followed by a third fixed number of counts. The number of counts during the second or variable phase of the cycle is a function of the setting of the potentiometer 66, the angular position of which thereby determines the frequency to which the receiver is tuned. The third phase of the counting cycle has a fixed number of counts with the number being a function of the offset frequency; i.e., 10.7 MHz. The number of counts counted by the counter during the three phases of the counting cycle is a direct function of the existing local oscillator output frequency and may be thought of as the integer required to divide the input from the prescaler 26 down to the frequency of the reference frequency source. That is, if the prescaler 26 provides input signals at a frequency of 9.88 MHz, the programmable divider serves to divide that input frequency by the integer 988 to produce an output signal at a 10 kHz rate. One count in the programmable divider corresponds to 100 kHz of frequency from the local oscillator 16 and the digits displayed in the display devices 52, 54, and 56 are chosen to represent the receiver channel frequency in multiples of 100 kHz.

The mode of operation of the programmable divider may be more readily understood in the following detailed description of its operation. At the beginning of the timing cycle (counter equals 1) the output of NAND gate 84 is high since the output Q3 from synchronous counter 44 is low. Under these conditions, the $\overline{\text{LOAD}}$ input to the synchronous counters is inhibited, allowing the counters to be incremented by the CLK signal from the prescaler 26. The counters will continue to be incremented by the CLK signal for counts 1-800. Count 800 ends the first fixed phase of the counting cycle.

At count 800, input Q3 to the monostable multivibrator 60 goes high, causing the multivibrator 60 to begin its own timing cycle. The duration of the timing cycle will vary as a function of the setting of the angular potentiometer 66 since this setting controls the charging rate for the capacitor 70. During this variable period of time, the synchronous counters will continue to be incremented by the CLK signal. When the period of time has elapsed (i.e., when the voltage at input 72 to the monostable multivibrator 60 has reached a predetermined trigger level), the output of the monostable multivibrator goes high to complete the second or variable phase of the counting cycle. The count reached by the counter 38 during this variable phase can range between 881 and 1079 which represent the minimum and maximum frequencies in the FM broadcast range divided by a factor of $10^5$. For any count within this range, Q3 will be a binary 1 while Q2 will be a binary 0. The inverted Q2 signal which is thus applied to NAND gate 84 will be a binary 1 at all times during the second or variable phase.

When the output Q1 from synchronous counter 40 goes to 1 upon the occurrence of the next CLK pulse, therefore, all inputs to NAND gate 84 will be at a binary 1 level causing the $\overline{\text{LOAD}}$ output of that gate to drop to a binary 0 level. The binary 0 $\overline{\text{LOAD}}$ signal on the output of the NAND gate 84 is a load enabling signal to the counter 38 and is also applied to the OR gate 88. On the trailing edge of the next CLK pulse, OR gate 88 generates an FFCLK signal causing the flip-flops 46, 48, and 50 to store the current contents of the synchronous counters 40, 42, and 44, respectively. Since the count contained in the synchronous counter 38 at the conclusion of the second variable phase of the cycle is a function of the frequency to which the receiver is tuned, display devices 56, 54, and 52 provide a direct digital readout of the tuned channel frequency. On the trailing edge of the same CLK pulse a fixed count of 1494 is synchronously loaded into the counter 38. The numbers 14, 9, and 4 loaded into counters 44, 42, and 40, respectively, are determined by input connections to ground for logic 0 and to line 90, which is connected to the +5 volt supply 62 through resistor 94, for logic 1.

When the fixed count of 1494 has been loaded into the synchronous counters, Q2 will be driven high. When the inverted Q2 output is applied to the NAND gate 84, its output will again go high permitting counting to continue. The synchronous counters will continue to be incremented by the CLK signal from the count 1494 through count 1599, which represents the maximum capacity of the counter 38. At this maximum count a binary 1 signal is produced on the carry output of synchronous counter 44. This binary 1 is the output to phase detector 30 and has the same frequency and phase, in the absence of drift, as the output frequency and phase of the reference frequency source. On the next CLK pulse the counter 38 advances to a count of 0.

It was noted above that the counting cycle was divided into three phases with the third phase being a function of the offset frequency, the second phase being a function of the channel frequency being tuned, and the first phase being a fixed arbitrary selected number of counts. In the specific embodiment under discussion the intermediate or offset frequency is 10.7 MHz. Thus, the count of 1494 is loaded into the counter at the start of the third phase so that during the third phase the counter counts through 107 states from 1494 to 0. During the first phase the counter counts from 1 to 800. If, for example, the receiver is tuned to 88.1 MHz. The frequency of the local oscillator is 98.8 MHz, therefore during the second phase the counter counts from 801 to 881, and the total counts for all three phases is 988.

The only variable in the counting cycle is established by the timing circuit including the angular potentiometer 66. This circuit provides a variable time delay during the second phase which corresponds to the number of counter states between the count 800 and that corresponding to the tuned channel frequency. The required time delay is not a linear function of the channel frequency being tuned, for although the number of counts in the second phase increases linearly with channel frequency, the time per count decreases. Assuming that the monostable multivibrator produces a time delay linearly proportional to its total timing resistance and that the frequency controlling potentiometer 66 has a resistance that varies linearly with angular rotation, the required non-linear delay versus control rotation needed is best obtained by the use of the parallel resistor 64 as well as the series resistor 68 as part of the resistive timing network controlling the monostable multivibrator 60.

To show that resistors 64, 66, and 68 can be chosen to give linear frequency control versus potentiometer rotation, let R be the resistance of potentiometer 66 between the voltage supply 62 and resistor 68, let S and H be the resistances of resistors 68 and 64, respectively, and neglect the effect of resistor 80. The desired linearity is obtained by choosing H such that it alone with the timing capacitor 70 would give a time delay in monostable multivibrator 60 equal to the full programmable divider cycle time, which is the reciprocal of the reference frequency. In the example given previously this time would be 100 microseconds. With the series combination of resistances R and S connected in parallel with resistance H the resulting resistance will be smaller and the time delay will be shorter by a factor $$\frac{R+S}{H+R+S}.$$

This ratio must therefore be equal to the ratio of counts in the second phase of the programmable divider cycle to the counts in a total cycle. This latter quantity is equal to $$\frac{C_{ch} - C_{st}}{C_{ch} \pm C_{off}}$$

where $C_{ch}$ is the count corresponding to the channel frequency, $C_{st}$ is the count at which the delay for the second phase begins, and $C_{off}$ is the count corresponding to the intermediate frequency offset. In the specific example given above $C_{ch}$ is 881, $C_{st}$ is 800, and $C_{off}$ is +107. Equating these ratios and solving for $$\frac{R+S}{H}$$

one gets $$\left(\frac{R+S}{H}\right) = \frac{C_{ch} - C_{st}}{C_{st} \pm C_{off}}$$

which shows that $C_{ch}$ is a linear function of R. If R is to allow tuning from $C_{min}$ to $C_{max}$ the required values of R and S are $$R = H\left(\frac{C_{min} - C_{st}}{C_{st} \pm C_{off}}\right)$$

$$S = H\left(\frac{C_{max} - C_{min}}{C_{st} \pm C_{off}}\right)$$

where H is chosen as described above and the plus sign is chosen when the local oscillator frequency is above the channel frequency and the minus sign is chosen when the local oscillator frequency is below the channel frequency.

A typical set of component values that would allow tuning of an FM receiver between 88 and 108 MHz with the circuitry shown in FIGS. 1 and 2 is tabulated below:

| Variable Resistor 66 | R | 5000 ohms |
|---|---|---|
| Fixed Resistor 68 | S | 2000 ohms |
| Fixed Resistor 64 | H | 22675 ohms |
| Fixed Capacitor 70 | | 6362 picofarads |

These values assume that the delay of the monostable multivibrator 60 is equal to the total resistance-capacitance time constant multiplied by the natural logarithm of 2.

If the variable time delay which occurs during the second phase of the counting cycle ends when the last significant digit of counter 40 is at a binary 0 level, the process of synchronously loading the fixed number 1494 into the counter will not be initiated until the least significant stage goes to a binary 1 level. This additional delay is desirable because standard FM broadcasting channels are odd multiples of 100 kHz. The function of the circuitry including flip-flop 76 is to provide an analog feedback to the time delay determining resistor-capacitor network which increases the delay by an amount equivalent to about ¼ to ½ of a CLK pulse period if the least significant bit at the end of the time delay is 0 or to decrease the delay by about the same amount if the least significant bit is a binary 1. The net result is to add tuning hysteresis so that the second phase will tend to end close to the even to odd transition of the counter (0 to 1) and jitter in the time delay will not change the selected channel.

The feedback signal from flip-flop 76 is fed to a resistive voltage divider including the upper portion of potentiometer 66, resistor 82, and resistor 78. Resistor 78 will, in a preferred embodiment, be a factor of 4 greater than resistor 82. That is, if resistor 82 is 1000 ohms, then resistor 78 will be 4000 ohms. The voltage at the junction of resistors 78 and 82 will be lower than the voltage on Q1 for the flip-flop 76 by a factor of 0.2 for the higher frequency channels and by a factor of 0.6 for the lower frequency channels. The feedback resistor 80 couples the adjustment voltage to the monostable multivibrator 60 at the proper level. Since the feedback arrangement varies the delay time only slightly, it has little influence on the choice of resistors 64, 66, and 68.

While there has been shown and described what is considered to be a preferred embodiment of the present invention, it will be obvious to those skilled in the art that various changes and modifications may be made therein without departing from the invention as defined by the appended claims.

What is claimed is:

1. For use in a frequency synthesizer having a phase-locked loop including an electrically controllable oscillator, a reference frequency source, and a phase detector circuit for comparing the output from the reference frequency source with a divided-down output from the electrically controllable oscillator; a programmable divider for generating the divided-down output comprising
    a counter circuit means operable to count through a recurring sequence of counts in response to clock pulses applied thereto and having an output connection coupled to the phase detector circuit;
    counter control means coupled to the counter circuit means comprising
        means for applying clock pulses to the counter circuit means at a rate dependent upon the output from the electrically controllable oscillator,
        timing means for providing a variable time delay period, said timing means initiating a variable time delay period in response to the occurrence of a first predetermined count in the counter circuit means and producing an indication upon termination of the variable time delay period, and
        loading means coupled to the timing means for loading a second predetermined count into the counter circuit means in response to an indication from the timing means upon termination of said variable time delay period;
    said counter circuit means being operable to apply an output pulse to the phase detector circuit in response to the occurrence of a third predetermined count in the counter circuit means.

2. A programmable divider as recited in claim 1 wherein said timing means includes adjustable analog means for determining the duration of said time delay period.

3. A programmable divider as recited in claim 2 wherein said timing means initiates a time delay period having a duration less than the period of time required for the counter circuit means to count from said first predetermined count to said second predetermined count in response to clock pulses applied thereto.

4. A programmable divider as recited in claim 3 including
    storage means coupled to the counter circuit means for storing the count accumulated in the counter circuit means at the termination of said time delay period; and
    display means coupled to the storage means for displaying an indication related to the count stored in the storage means.

5. A programmable divider as recited in claim 3 wherein
    said timing means includes
        a monostable multivibrator having a first input connection coupled to the counter circuit means and having a second input connection,
        a source of fixed voltage,
        a timing capacitance having one terminal connected to the second input to the monostable multivibrator and the other terminal connected to a point of fixed reference potential,
        a fixed resistance connected in series between the source of fixed voltage and the second input to said monostable multivibrator, and
        a variable resistance connected in parallel with the fixed resistance for adjusting the duration of the time delay period,
        the monostable multivibrator being switched to one operating state in response to the occurrence of said first predetermined count in the counter circuit means and being switched to another operating state in response to a predetermined voltage at the second input connection upon termination of said delay time period;
    said loading means being coupled to the monostable multivibrator and being operable to load said second predetermined count into the counter circuit means in response to the monostable multivibrator switching from said one operating state to said other operating state.

6. For use in a receiver having a phase-locked loop including an electrically controllable local oscillator having a range of output frequencies offset from the range of receiver input frequencies by a fixed offset frequency, a reference frequency source, and a phase detector circuit for comparing the output of the reference frequency source with a divided-down output from the electrically controllable local oscillator; a programmable divider for generating the divided-down output comprising counter circuit means operable to count through a recurring sequence of counts in response to clock pulses applied thereto and having an output connection coupled to the phase detector circuit;

counter control means coupled to the counter circuit means comprising means for applying clock pulses to the counter circuit means at a rate dependent upon the output from the electrically controllable local oscillator, timing means for providing a variable time delay period, said timing means initiating a variable time delay period in response to the occurrence of a first predetermined count in the counter circuit means, and producing an indication upon termination of the variable time delay period, the duration of the time delay period determining the tuned input frequency of the receiver, and loading means coupled to the timing means for loading a second predetermined count into the counter circuit means in response to an indication from the timing means upon termination of said variable time delay period, the duration of the time delay period initiated by the timing means being less than the time period required for the counter circuit means to count from said first predetermined count to said second predetermined count in response to clock pulses applied thereto;

said counter circuit means being operable to apply an output pulse to the phase detector circuit in response to the occurrence of a third predetermined count in the counter circuit means.

7. A programmable divider as recited in claim 6 wherein said timing means includes adjustable analog means for determining the duration of said time delay period and consequently the tuned input frequency of the receiver.

8. A programmable divider as recited in claim 7 including storage means coupled to the counter circuit means for storing the count accumulated in the counter circuit means at the termination of said time delay period; and display means coupled to the storage means for displaying an indication related to the count stored in the storage means and corresponding to the tuned input frequency of the receiver.

* * * * *